United States Patent [19]

Boksiner et al.

[11] Patent Number: 5,047,724
[45] Date of Patent: Sep. 10, 1991

[54] POWER CABLE ARCING FAULT DETECTION SYSTEM

[75] Inventors: Jeffrey Boksiner, Randolph; Michael Parente, Florham Park, both of N.J.

[73] Assignee: Bell Communications Research, Inc., N.J.

[21] Appl. No.: 452,968

[22] Filed: Dec. 19, 1989

[51] Int. Cl.⁵ ............................................. G01R 31/02
[52] U.S. Cl. ..................................... 324/520; 324/521; 324/77 R; 324/77 B; 324/72; 379/26; 364/576
[58] Field of Search ................. 364/576; 324/72, 72.5, 324/520, 521, 536, 77 R, 77 B; 379/26

[56] References Cited

U.S. PATENT DOCUMENTS

| | | |
|---|---|---|
| 3,882,287 | 5/1975 | Simmonds . |
| 3,904,839 | 9/1975 | Peoples . |
| 4,063,168 | 12/1977 | Franke .................................. 324/72 |
| 4,100,487 | 7/1978 | Wojtasinski ........................... 324/72 |
| 4,191,921 | 3/1980 | Yoshino ................................. 324/72 |
| 4,229,626 | 10/1980 | Peoples . |
| 4,630,228 | 12/1986 | Tarezy-Hornoch et al. . |
| 4,775,839 | 10/1988 | Kosina ................................... 324/536 |
| 4,823,228 | 4/1989 | Bittner .................................... 324/72 |
| 4,897,607 | 1/1990 | Grunewald ............................. 324/436 |

FOREIGN PATENT DOCUMENTS 0901947  1/1982  U.S.S.R. ............................. 324/536

Primary Examiner—Kenneth A. Wieder
Assistant Examiner—Jose M. Solis
Attorney, Agent, or Firm—James W. Falk; Leonard Charles Suchyta; Lionel N. White

[57] ABSTRACT

A system for detecting an arcing fault in a telephone central office DC power distribution conductor repeatedly measures the current flow in the distribution line, as with an inductive coupling, and derives a Fourier transform analysis spectrum from such measurements. The power values at intervals across the frequency spectrum are compared with recorded threshold template values encompassing the spectrum typical of an arcing event and an alarm condition is established when such threshold levels are exceeded.

13 Claims, 3 Drawing Sheets

POWER CABLE ARCING FAULT DETECTION SYSTEM

BACKGROUND OF THE INVENTION

Arcing from electrical power cables at points of worn or damaged insulation constitutes a significant fire hazard in most building environments. This is particularly so in telephone company central offices which may remain unoccupied for considerable lengths of time. Although the DC power supply systems in these locations include protective fuses to ensure interruption of dangerous current flow in the event of a short circuit, the level and duration of the momentary current surge at the instant of arcing are usually insufficient to actuate such fused protection. The heat accompanying such arcing is, however, quite capable of initiating a destructive fire.

There is thus a definite need for a means by which arcing in a damaged electrical system may be detected and an alert or disconnect signal given in time to avert serious losses. The present invention provides such a means through recognition of the characteristic frequency domain energy distribution pattern generated by the arcing itself. By continually monitoring the power supply system for the appearance of such a pattern, the invention is able to provide early warning of a hazardous arcing condition.

SUMMARY OF THE INVENTION

As a result of our examining the effects of arcing in systems with high performance DC power supplies, e.g. battery strings which are utilized to support telephone central office operations, we have discovered that the frequency domain energy distribution patterns, or power spectra, of current and voltage measurements in such a system, as revealed by Fourier transform analysis, change characteristically from those of normal operation at instances of arcing in the system. Therefore, by monitoring such a pattern one is able to obtain an early warning of the existence of a dangerous arcing condition in such circuits.

Measurements of one of these parameters are continually taken at the power supply cable, for example by means of a non-invasive current probe, and these data are processed in a spectrum analysis system to obtain the Fourier transform pattern for selected sampling spans that will encompass a significant portion of any arcing event. These patterns may be compared in real time or after the initial recording of measurement data with a template of threshold values established from typical patterns characteristic of power supply arcing events. Excursions of the transform patterns beyond these selected thresholds are then utilized to trigger an alarm to notify operating personnel of the existence of arcing danger, or they may be employed to initiate a complete isolation of the power source in particularly vulnerable environments.

THE DRAWING

The present invention will be described with reference to the accompanying drawing of which:

Figure 2:
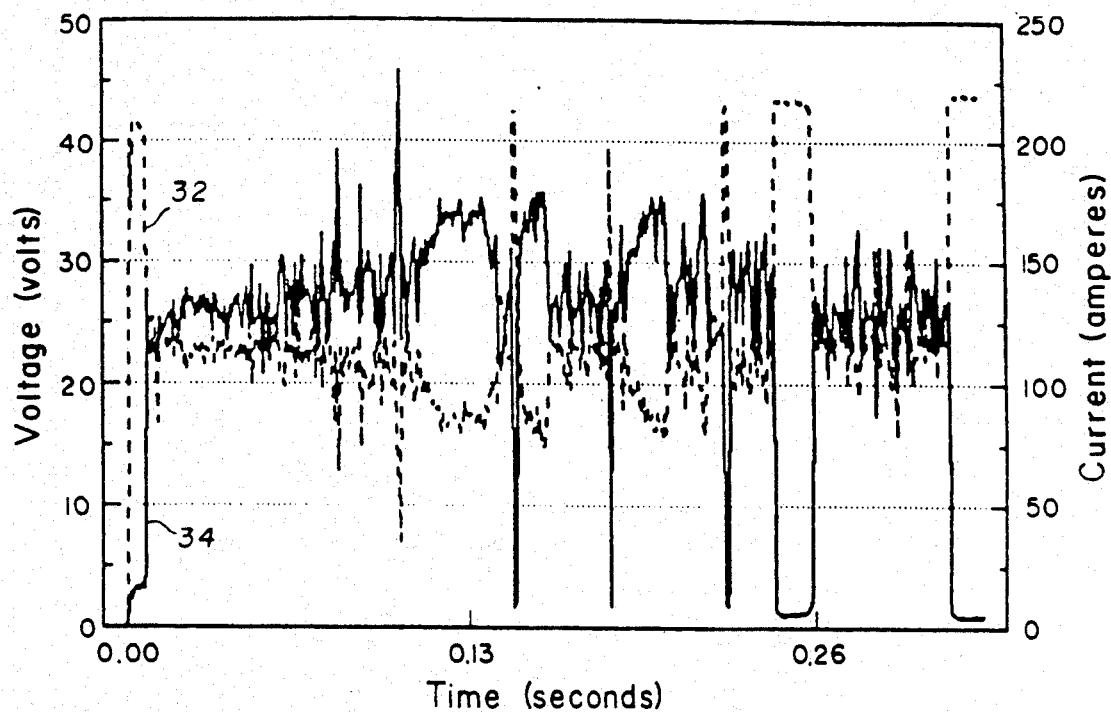
FIG. 2 is a composite trace of voltage and current amplitude variations occurring during the period of an arcing event in a DC power distribution circuit under test.
Figure 3:
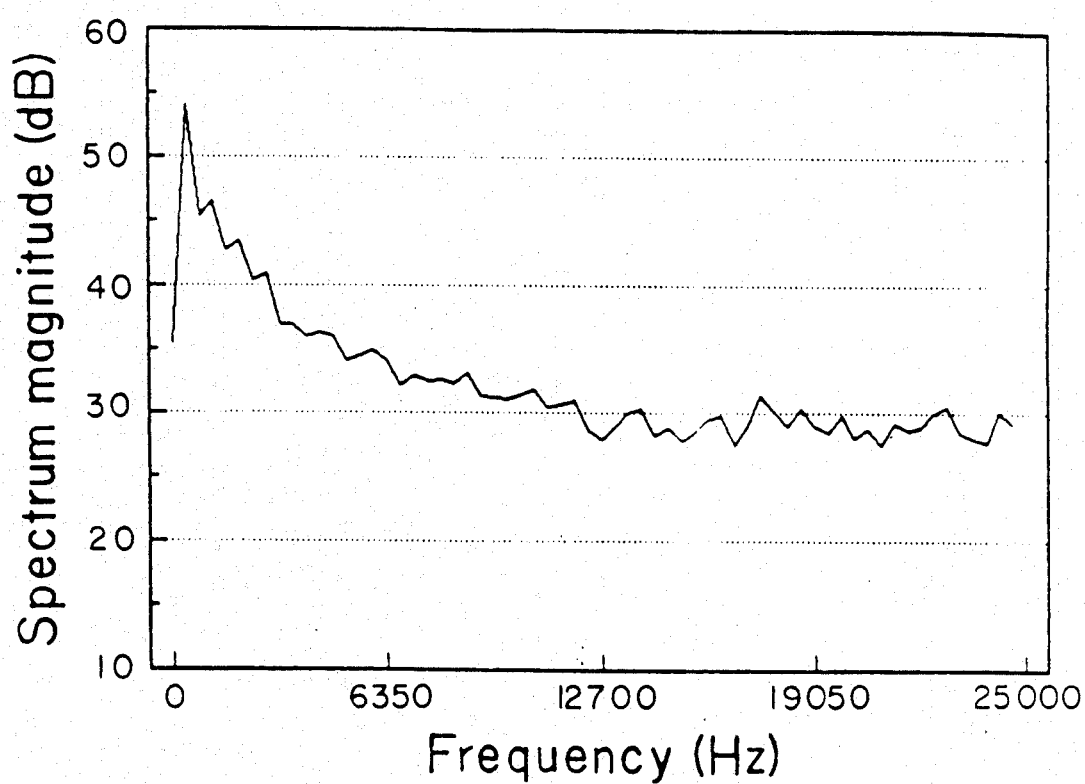
Figure 4:
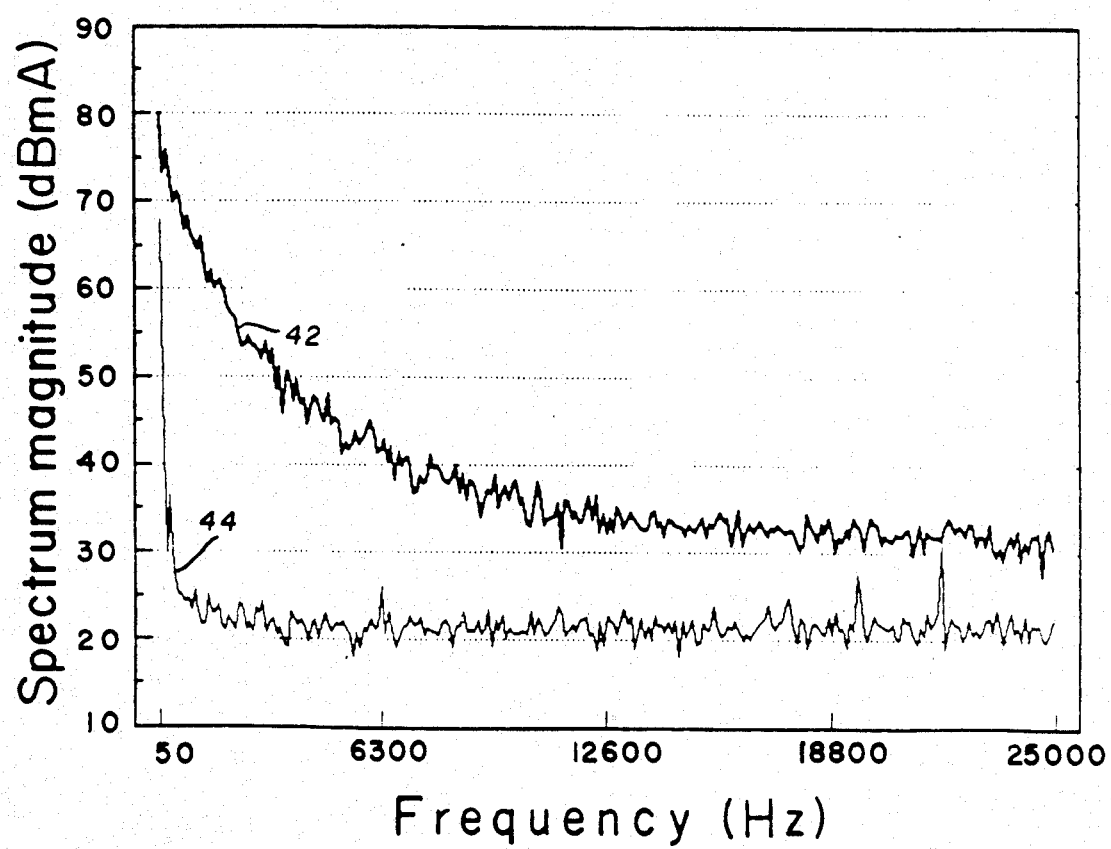
Figure 5:
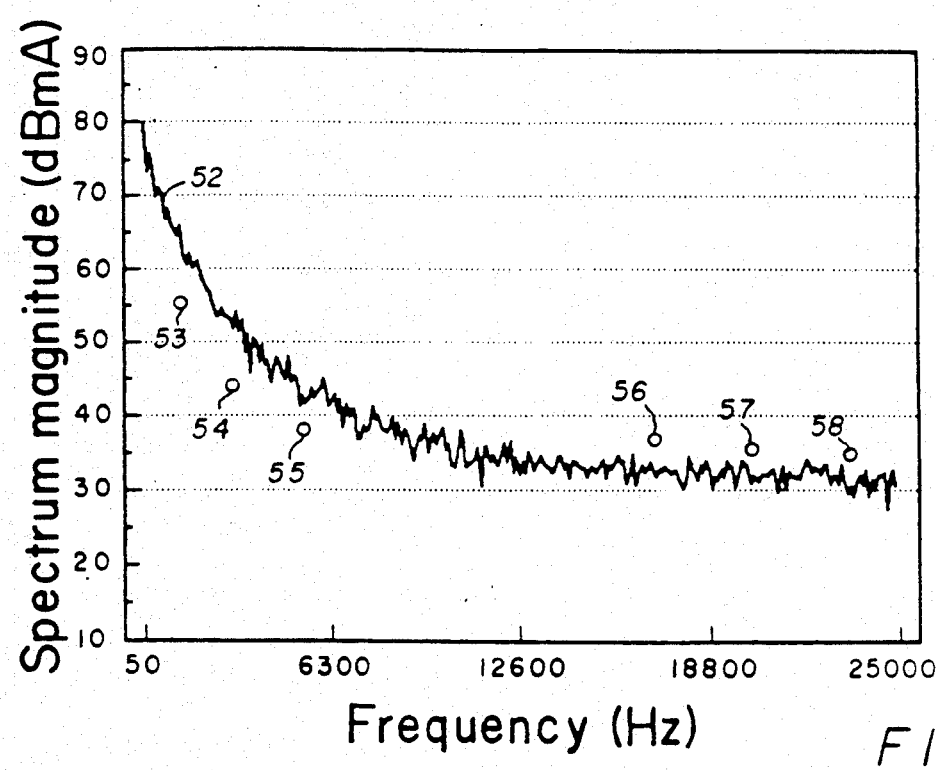

FIG. 3 is a trace of the frequency transform spectrum of the voltage variations of FIG. 2; and FIG. 4 is a composite trace of the frequency transform spectra of the current variations of FIG. 2 and of current variations occurring during normal operations in the same distribution circuit; and FIG. 5 is a trace of the arcing event frequency transform spectrum of FIG. 4 overlaid with selected minimum and maximum threshold points.

DESCRIPTION OF THE INVENTION

Figure 1:
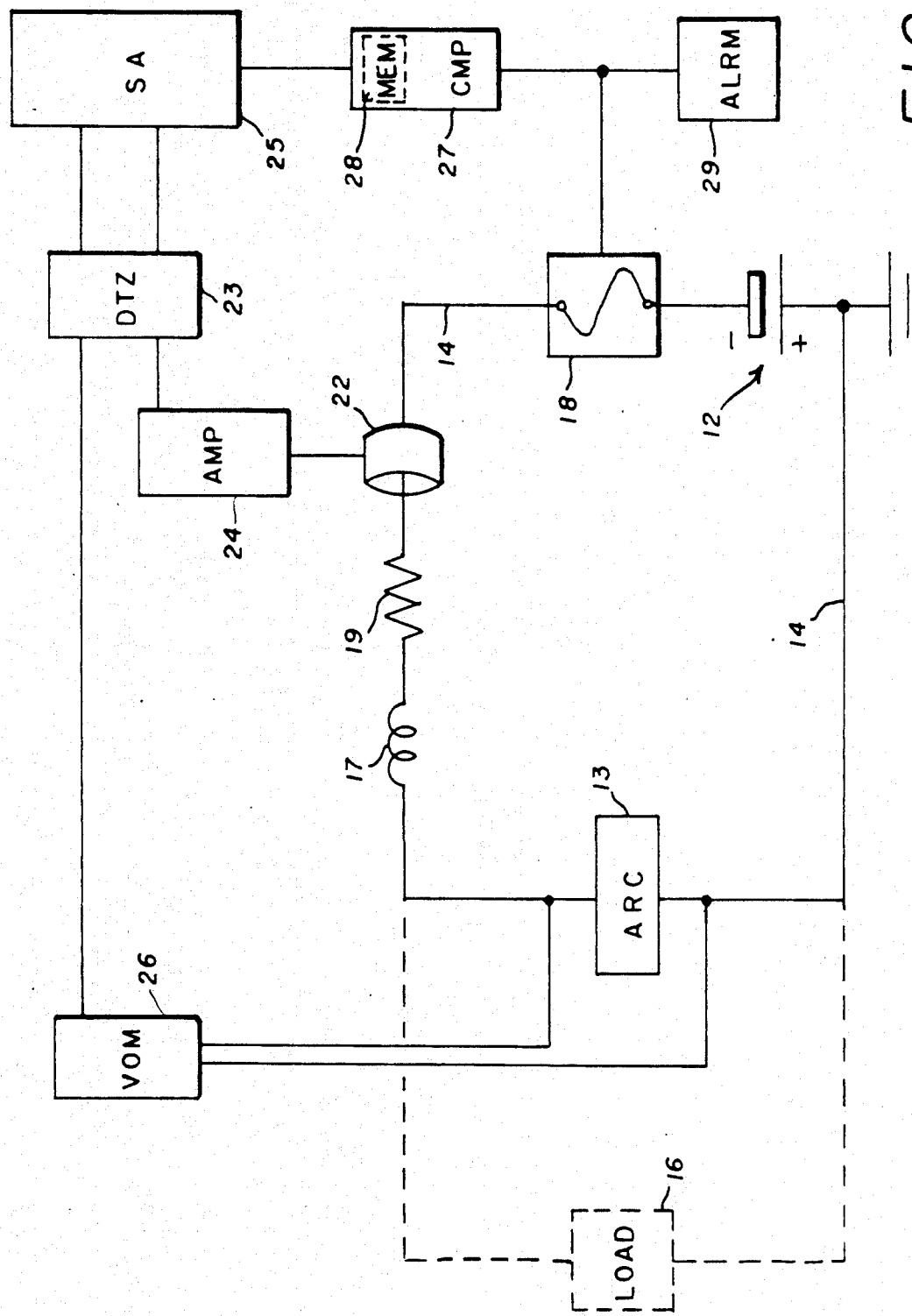
FIG. 1 is a block diagram of an embodiment of the detection system of the present invention.

The typical arrangement of a DC power distribution circuit in a telephone central office (CO) is simply shown in FIG. 1 as comprising a 48 VDC power source 12, usually in the form of rectified AC with redundancy comprising a series string of electrolytic cell batteries, distribution cable 14, and a load as generally represented at 16 which normally comprises the numerous telephone equipment elements supported by the CO. An appropriate fuse or breaker 18 provides protection against extended short circuits in the system. Also depicted in FIG. 1 is the site 13 of an arc which may occur when an uninsulated portion of the conductor of cable 14 comes into sufficiently close proximity to a grounded conductive system member, such as the cladding of Type-AC armored cable or a metal CO cable rack structure. It is an object of the present invention to provide an indication of the occurrence of such an arcing event.

The elements of a detection system of the invention are also shown in FIG. 1 and comprise a current probe 22 and amplifier (AMP) 24, digitizer (DTZ) 23, spectrum analyzer (SA) 25, comparator (CMP) 27, and alarm (ALRM) 29. Although the transform spectrum pattern of voltage variations in an arcing event, such as may be measured with voltmeter (VOM) 26, exhibits distinct characteristics, as evidenced in the pattern trace of FIG. 3, the limitations on arcing site selection and sampling suggest current flow measurements as the preferred means for general implementation of the present detection procedure. The ability to measure from a single location in the power distribution circuit the variations in current flow caused by an arcing event occurring anywhere in the system makes that approach the more practical. The ready availability of non-invasive measuring probes further supports the use of current measurement in this novel procedure.

Current probe 22 and its associated amplifier 24 are simplified representations of devices employed as examples in a test circuit embodying the present invention. In such an arrangement, those system elements were a combination of a Model A6302 current probe with a Model CT-4 current transformer and a Model AM 503 current probe amplifier (all manufactured by Tektronix Corporation, Beaverton, OR). The addition of a Model MD510 current probe (AEMC Corporation, Boston, MA) with a Krohmite amplifier provided the input to the DC bucking coil of the CT-4 probe.

The 48V power source 12 for the test circuit of the example comprised three parallel strings of four 12V DC automotive batteries each. The circuit included a 180 amp protective fuse 18, and a 20 microhenry inductor 17 and current limiting resistor 19 were inserted to simulate a typical central office power distribution system having about 20 meters of cable and provided a resistive arc fault path resembling that of the armored cable cladding likely to be encountered in actual usage.

An arc condition was established in the test circuit at 13 by removing a section of cable insulation and placing the bared conductor about 2-3 millimetres from a grounded section of Type-AC armored cable cladding. When the gap was spanned with a 0.5 mm graphite rod an arc was initiated and persisted for a few tenths of a second without affecting fuse 18. During the arcing event, the current and voltage amplitudes were measured with instrumentation 22-24 and 26 and were seen to vary in the manner depicted in the time domain traces 32 (dotted) and 34 (solid), respectively, of FIG. 2.

These amplitude data were digitized, as in 23, at a 50 KHz rate with ten bit resolution and input to spectrum analyzer 25 where they were processed to derive the frequency domain transform data represented in the unique pattern traces of the voltage spectrum of FIG. 3 and the current spectrum 42 of FIG. 4. In addition to the arcing event spectrum trace 42, a comparative transform pattern trace 44 of current amplitude data typically acquired during a period of normal power transmission system operation is shown in FIG. 4. It is in the unique difference between these patterns that we have found the basis of our novel process for discovering occasions of arcing in a power distribution system and alerting appropriate CO personnel.

As shown in FIG. 1, the transform data obtained in analyzer 25 are transmitted to comparator 27 where they are compared with threshold spectrum values stored, for example, in comparator memory element (MEM) 28. These values, such as represented at points 53-58 in FIG. 5, are selected to provide a threshold template encompassing the typical arcing event trace 52. This template generally comprises maximum values in the lower frequency range, such as at 53-55, which will be exceeded upon the occurrence of arcing, and minimum values in the higher frequency range, such as at 56-58, which would not normally at the same time be exceeded in the transform spectra of spurious non-arc events such as power surges, lightning strikes, and the like. Thus, a spectrum pattern which is at once both above the maximum and below the minimum threshold values will be confirmed as that of an arcing event. Such a confirmation at comparator 27 provides a signal that is transmitted to either or both of alarm 29 which will alert maintenance personnel or, as would be particularly useful in outlying central offices or extremely high risk environments, means, such as at fuse/breaker 18, to cause immediate interruption of the power circuit.

In the noted example, the amplitude data were initially recorded for subsequent digitizing to provide data for the Fast Fourier Transform (FFT) computations. While real-time spectrum analysis is effective in the present procedure, it is often preferable to employ intermediate data recording, since this enables the use of data compression techniques which prove particularly useful in view of the anticipated extent of mean time between arcing events. Such a practice also provides for a most economical use of spectrum analysis equipment by enabling its sharing among a number of power transmission systems under surveillance.

Presently available spectrum analyzer systems, such as the Tektronix TEK 3052 Digital Spectrum Analyzer and the HP 35660A Signal Analyzer (Hewlett-Packard Company, Palo Alto, CA), are capable of providing a sufficient level of monitoring and processing support for this arc detection invention. Such systems may, in fact, combine into one unit the sampling and digitizing functions of digitizer 23, the FFT analysis function of spectrum analyzer 25, the threshold template comparison and signaling functions of comparator 27, and the alerting function of alarm 29. Alternatively, simpler analyzer systems may be assembled from individual commercially available digitizers, event recorders, and personal computers with conventional FFT analysis programs. Such computers may likewise be employed with routine programming to provide the threshold template storage and comparison functions as well as the alarm signaling. Other variations in apparatus selection and arrangement will undoubtedly become apparent to the skilled artisan in the light of the foregoing description, and those and similar embodiments are nonetheless intended to be within the scope of the present invention as recited in the appended claims.

What is claimed is:

1. A method of detecting the occurrence of an arcing event in an electrical circuit which comprises:
   a) establishing a template of threshold frequency domain power values encompassing at least a portion of a reference frequency domain spectrum of measurements of an electrical parameter in such a circuit during an arcing event;
   b) continually obtaining test measurements of said electrical parameter in said electrical circuit;
   c) deriving frequency domain test spectra of said test measurements;
   d) comparing said frequency domain test spectra with said threshold template; and
   e) providing an arc detection signal when one or more of said frequency domain test spectra deviates beyond said template.

2. The method according to claim 1 wherein said electrical parameter is current flow.

3. The method according to claim 1 wherein said electrical parameter is voltage.

4. The method according to claim 1 wherein said establishing of a threshold template comprises:
   a) obtaining measurements of said electrical parameter during an arcing event;
   b) deriving a reference frequency domain spectrum of said parameter measurements;
   c) designating as a maximum threshold value at least one said power value that is below said reference spectrum portion in its lower frequency range; and
   d) designating as a minimum threshold value at least one said power value that is above said reference spectrum portion in its higher frequency range.

5. The method according to claim 4 wherein said arc detection signal is provided when said one or more test spectrum is situated above said at least one maximum threshold value and below said at least one minimum threshold value.

6. The method according to claim 1 which further comprises the step of providing a sensible alarm in response to said arc detection signal.

7. The method according to claim 1 which further comprises the step of interrupting said circuit in response to said arc detection signal.

8. A system for detecting the occurrence of an arcing event in a electrical circuit which comprises:
   a) means for storing a template of threshold frequency domain power values encompassing at least a portion of a reference frequency domain spectrum of measurements of an electrical parameter in such a circuit during an arcing event;

b) means for continually obtaining test measurements of said electrical parameter in said electrical circuit;

c) analyzer means for deriving frequency domain test spectra of said test measurements; and d) means for comparing said frequency domain test spectra with said threshold template and providing an arc detection signal when one or more of said frequency domain test spectra deviates beyond said template.

9. The system according to claim 8 wherein said electrical parameter is current flow.

10. The system according to claim 8 wherein said electrical parameter is voltage.

11. The system according to claim 8 which further comprises means for providing a sensible alarm in response to said arc detection signal.

12. The system according to claim 8 which further comprises means for interrupting said circuit in response to said arc detection signal.

13. The system according to claim 8 wherein said analyzer means further comprises:

a) means for digitizing said test measurements; and b) means for calculating the Fast Fourier Transform of said digitized test measurements.

* * * * *